United States Patent
Kyung

(10) Patent No.: US 10,269,424 B2
(45) Date of Patent: Apr. 23, 2019

(54) SEMICONDUCTOR MEMORY APPARATUS

(71) Applicant: SK hynix Inc., Icheon-si, Gyeonggi-do (KR)

(72) Inventor: Ki Myung Kyung, Daejeon (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/669,689

(22) Filed: Aug. 4, 2017

(65) Prior Publication Data

US 2018/0047445 A1    Feb. 15, 2018

(30) Foreign Application Priority Data

Aug. 10, 2016  (KR) .................. 10-2016-0101929

(51) Int. Cl.
*G11C 13/00*   (2006.01)

(52) U.S. Cl.
CPC ........ *G11C 13/0028* (2013.01); *G11C 13/003* (2013.01); *G11C 13/0023* (2013.01); *G11C 13/0038* (2013.01); *G11C 13/0069* (2013.01); *G11C 2013/0073* (2013.01); *G11C 2213/79* (2013.01); *G11C 2213/82* (2013.01)

(58) Field of Classification Search
CPC .................. G11C 13/0069; G11C 13/0004
USPC .................................. 365/148, 158
See application file for complete search history.

(56) References Cited

U.S. PATENT DOCUMENTS

| | | | |
|---|---|---|---|
| 8,107,283 B2 | 1/2012 | Chen | |
| 9,007,814 B1 | 4/2015 | Derhacobian | |
| 9,224,471 B2 | 12/2015 | Chen | |
| 2013/0301335 A1* | 11/2013 | Ong | G11C 29/06 365/148 |
| 2015/0043271 A1* | 2/2015 | Ong | G11C 11/1675 365/158 |
| 2015/0063020 A1* | 3/2015 | Kajigaya | G11C 11/1675 365/158 |

* cited by examiner

*Primary Examiner* — Huan Hoang
(74) *Attorney, Agent, or Firm* — William Park & Associates Ltd.

(57) ABSTRACT

A semiconductor memory apparatus may be provided. The semiconductor memory apparatus may include a memory element. The semiconductor memory apparatus may include a first switching driving circuit coupled to the memory element. The semiconductor memory apparatus may include a second switching driving circuit coupled to the memory element.

20 Claims, 4 Drawing Sheets

SEMICONDUCTOR MEMORY APPARATUS

CROSS-REFERENCES TO RELATED APPLICATION

This application claims priority under 35 U.S.C. 119(a) to Korean application No. 10-2016-0101929, filed on Aug. 10, 2016, in the Korean intellectual property Office, which is incorporated by reference in its entirety as set forth in full.

BACKGROUND

1. Technical Field

Various embodiments may generally relate to a semiconductor integrated circuit, and more particularly, to a semiconductor memory apparatus.

2. Related Art

Semiconductor memory apparatuses receive and store data, and output the stored data.

The semiconductor memory apparatuses are categorized into volatile memory apparatuses which store data only while a power voltage is being applied and nonvolatile memory apparatuses which retain stored data even when the power voltage is interrupted.

The number of times data is written in a memory cell which is for storing data may be fixed for the nonvolatile memory apparatus. As the number of times data is written in the memory cell of the nonvolatile memory apparatus is increased, the composition of the memory cell may be changed and thus the memory cell may not be able to perform a normal function.

SUMMARY

According to an embodiment, a semiconductor memory apparatus may be provided. The semiconductor memory apparatus may include a memory element. The semiconductor memory apparatus may include a first switching driving circuit coupled to the memory element. The semiconductor memory apparatus may include a second switching driving circuit coupled to the memory element.

DETAILED DESCRIPTION

Figure 1:
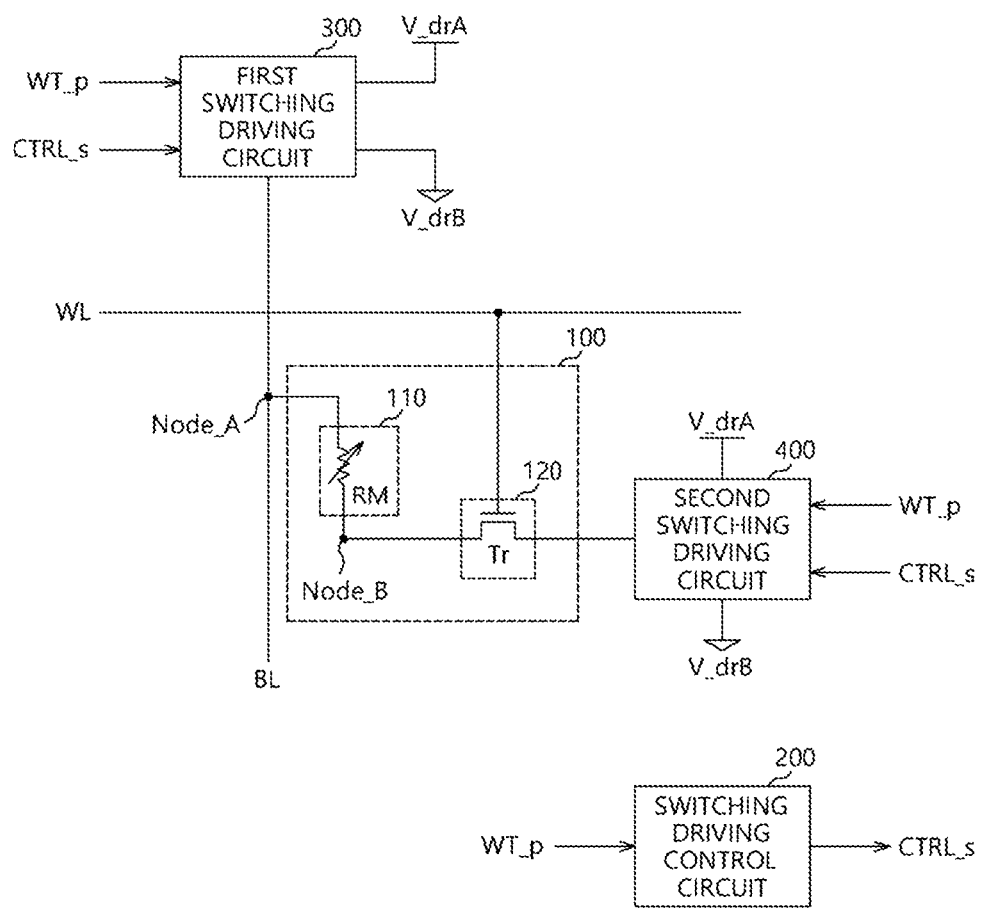
FIG. 1 is a configuration diagram illustrating a semiconductor memory apparatus according to an embodiment of the disclosure.

Hereinafter, examples of embodiments will be described with reference to the accompanying drawings. Examples of embodiments are described herein with reference to cross-sectional illustrations that are schematic illustrations of examples of embodiments (and intermediate structures). As such, variations from the shapes of the illustrations as a result, for example, of manufacturing techniques and/or tolerances, are to be expected. Thus, examples of embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

The concepts are described herein with reference to cross-section and/or plan illustrations that are schematic illustrations of idealized embodiments of the concepts. However, embodiments of the concepts should not be limited construed as limited to the concepts. Although a few embodiments of the concepts will be illustrated and described, it will be appreciated by those of ordinary skill in the art that changes may be made in these examples of embodiments without departing from the principles and spirit of the concepts.

For reference, an embodiment including additional components may be provided. Furthermore, an active high or active low configuration indicating an active state of a signal or circuit may be changed depending on embodiments. As such, the logic levels of the signals may be different from or the opposite of those described. For example, a signal described as having a logic "high" level may alternatively have a logic "low" level, and a signal described as having a logic "low" level may alternatively have a logic "high" level. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Referring to FIG. 1, a semiconductor memory apparatus according to an embodiment may include a memory cell 100, a switching driving control circuit 200, a first switching driving circuit 300, and a second switching driving circuit 400.

The memory cell 100 may be configured to include one memory element 110 and one switching element 120.

One end of the memory element 110 may be coupled to a bit line BL and the other end of the memory element 110 may be coupled to the switching element 120. For example, the memory element 110 may include a resistive memory element RM. In this example, the resistive memory element RM may be phase-change by a difference of voltages applied to both ends of the resistive memory element 110 and a resistance value of the resistive memory element 110 may be changed according to the phase-change. A node in which the memory element 110 is coupled to the bit line BL may refer to a first node Node_A and a node in which the resistive memory element 110 is coupled to the switching element 120 may refer to a second node Node_B.

When a word line WL is enabled, the switching element 120 may couple the memory element 110 and the second switching driving circuit 400. The switching element 120 may be configured to include a transistor Tr. The word line WL may be coupled to a gate of the transistor Tr and the other end of the memory element 110 and the second switching driving circuit 400 may be coupled to a source and a drain of the transistor Tr.

The switching driving control circuit 200 may generate a control signal CTRL_s in response to a write pulse WT_p. For example, the switching driving control circuit 200 may be configured to allow the control signal CTRL_s to be transited whenever the write pulse WT_p is input. In this example, the switching driving control circuit 200 may be configured to enable the control signal CTRL_s when the write pulse WT_p is first input and disable the control signal CTRL_s when the write pulse WT_p is input again. In another example, the switching driving control circuit 200 may be configured to allow the control signal CTRL_s to be transited when the preset number of write pulses WT_p is input. In this example, the switching driving control circuit 200 may be configured to enable the control signal CTRL_s when the preset number of write pulses WT_p is input and disable the control signal CTRL_s when the preset number of write pulses WT_p is input after the control signal CTRL_s is enabled.

The first switching driving circuit 300 may transfer one of a first driving voltage V_drA and a second driving voltage V_drB to the bit line BL in response to the write pulse WT_p and the control signal CTRL_s. For example, when the control signal CTRL_s is disabled and the write pulse WT_p is input, the first switching driving circuit 300 may transfer the first driving voltage V_drA to the bit line BL during an enable period of the write pulse WT_p. When the control signal CTRL_s is enabled and the write pulse WT_p is input, the first switching driving circuit 300 may transfer the second driving voltage V_drB to the bit line BL during the enable period of the write pulse WT_p. The first driving voltage V_drA may be a voltage having a higher voltage level than the second driving voltage V_drB. The first and second driving voltages V_drA and V_drB may be voltages which are applied from the outside of the semiconductor memory apparatus or voltages which are internally generated in the semiconductor memory apparatus.

The second switching driving circuit 400 may transfer one of the first driving voltage V_drA and the second driving voltage V_drB to the memory cell 100, that is, the switching element 120 in response to the write pulse WT_p and the control signal CTRL_s. For example, when the control signal CTRL_s is disabled and the write pulse WT_p is input, the second switching driving circuit 400 may transfer the second driving voltage V_drB to the switching element 120 during the enable period of the write pulse WT_p. When the control signal CTRL_s is enabled and the write pulse WT_p is input, the second switching driving circuit 400 may transfer the first driving voltage V_drA to the switching element 120 during the enable period of the write pulse WT_p.

Operations of the first and second switching driving circuits 300 and 400 in response to the control signal CTRL_s and the write pulse WT_p will be described below.

When the first switching driving circuit 300 provides the first driving voltage V_drA to the bit line BL, the second switching driving circuit 400 may provide the second driving voltage V_drB to the switching element 120. When the first switching driving circuit 300 provides the second driving voltage V_drB to the bit line BL, the second switching driving circuit 400 may provide the first driving voltage V_drA to the switching element 120.

Figure 2:
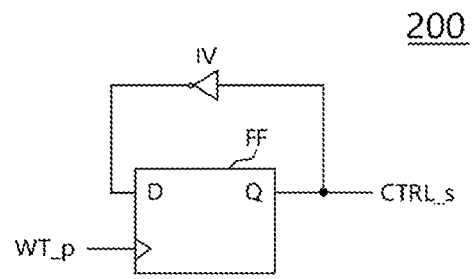
FIG. 2 is a configuration diagram illustrating a switching driving control circuit of FIG. 1.

Referring to FIG. 2, the switching driving control circuit 200 according to an embodiment may include a flip flop FF and an inverter IV. The flip flop FF may receive the write pulse WT_p through a clock input terminal, receive an output signal of the inverter IV through a signal input terminal D, and output the control signal CTRL_s through a signal output terminal Q. The inverter IV may receive the control signal CTRL_s and output an inverted control signal to the signal input terminal D of the flip flop FF.

The switching driving control circuit 200 having an above-described configuration may change a phase of the control signal CTRL_s whenever the write pulse WT_p is input. For example, the switching driving control circuit 200 may enable the control signal CTRL_s when the write pulse WT_p is first input and disable the control signal CTRL_s when the write pulse WT_p is input again.

Figure 3:
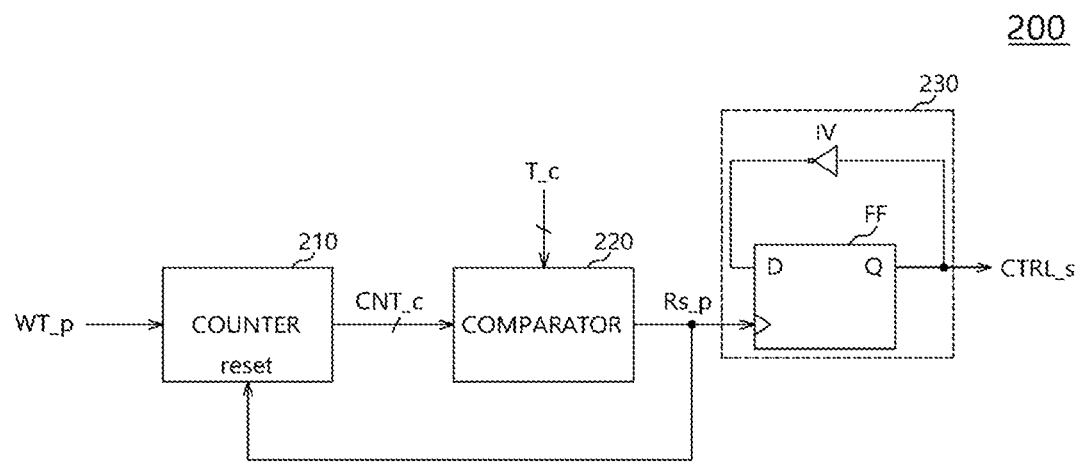
FIG. 3 is a configuration diagram illustrating a switching driving control circuit of FIG. 1.

Referring to FIG. 3, the switching driving control circuit 200 according to an embodiment may include a counter 210, a comparator 220, and a control signal generator 230.

The counter 210 may generate a counting code CNT_c in response to the write pulse WT_p and a reset pulse Rs_p. For example, the counter 210 may generate the counting code CNT_c by counting the write pulse WT_p whenever the write pulse WT_p is input and may reset the counting code CNT_c when the reset pulse Rs_p is input.

The comparator 220 may generate the reset pulse Rs_p by comparing the counting code CNT_c and a target code T-c. For example, the comparator 220 may generate the reset pulse Rs_p when the counting code CNT_c is the same as the target code T_c. In this example, the reset pulse Rs_p may be input to the counter 210 and the counter 210 may initialize the counting code CNT_c when the reset pulse Rs_p is input.

The control signal generator 230 may change the phase of the control signal CTRL_s whenever the reset pulse Rs_p is input. The control signal generator 230 may include a flip flop FF and an inverter IV. The flip flop FF may receive the reset pulse Rs_p through a clock input terminal, receive an output signal of the inverter IV through a signal input terminal D, and output the control signal CTRL_s through a signal output terminal Q. The inverter IV may receive the control signal CTRL_s and output an inverted control signal to the signal input terminal D of the flip flop FF.

The switching driving control circuit 200 having an above-described configuration may change the phase of the control signal CTRL_s when the preset number of write pulses WT_p is input, that is, a code value of the counting code CNT_c becomes equal to a code value of the target code T_c. For example, when the preset number of write pulses WT_p is input, that is, when the code value of the counting code CNT_c counted whenever the write pulse WT_p is input becomes equal to the code value of the target code T_c, the switching driving control circuit 200 may enable the control signal CTRL_s and initialize the counting code CNT_c by generating the reset pulse Rs_p. When the preset number of write pulses WT_p is input again, that is, when the counting code CNT_c which is initialized is counted whenever the write pulse WT_p is input and the code value of the counting code CNT_c becomes equal to the code value of the target code T_c, the switching driving control circuit 200 may disable the control signal CTRL_s.

Figure 4:
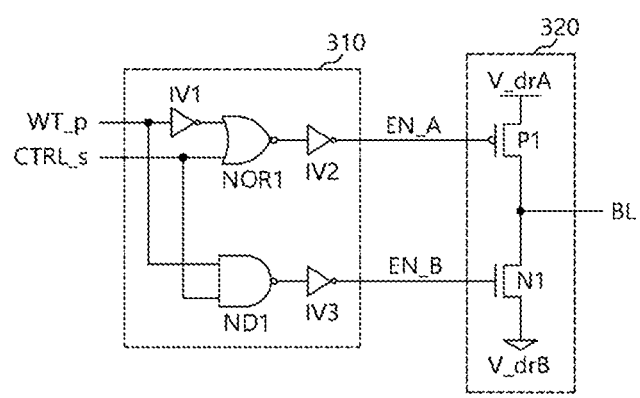
FIG. 4 is a configuration diagram illustrating a first switching driving circuit of FIG. 1.

Referring to FIG. 4, the first switching driving circuit 300 may include a first enable signal generator 310 and a first driver 320.

The first enable signal generator 310 may generate a first driving enable signal EN_A and a second driving enable signal EN_B in response to the write pulse WT_p and the control signal CTRL_s. For example, the first enable signal generator 310 may enable one of the first and second driving enable signals EN_A and EN_B in response to the write pulse WT_p and the control signal CTRL_s. In this example, the first enable signal generator 310 may disable both the first and second driving enable signals EN_A and EN_B so that neither of the first and second driving voltages V_drA and V_drB may be provided to the bit line BL in a disable period of the write pulse WT_p. The first enable signal generator 310 may enable one of the first and second driving enable signals EN_A and EN_B so that one of the first and second driving voltages V_drA and V_drB may be provided to the bit line BL in response to the control signal CTRL_s in the enable period of the write pulse WT_p. When the write pulse WT_p is enabled and the control signal CTRL_s is disabled, the first enable signal generator 310 may enable the first driving enable signal EN_A so that the first driving voltage V_drA of the first and second driving voltages V_drA and V_drB may be provided to the bit line BL. When the write pulse WT_p is enabled and the control signal CTRL_s is enabled, the first enable signal generator 310 may enable the second driving enable signal EN_B so that the second driving voltage V_drB of the first and second driving voltages V_drA and V_drB may be provided to the bit line BL.

The first enable signal generator 310 may include first to third inverters IV1, IV2, and IV3, a first NOR gate NOR1, and a first NAND gate ND1. The first inverter IV1 may receive the write pulse WT_p. The first NOR gate NOR1 may receive the control signal CTRL_s and an output signal of the first inverter IV1. The second inverter IV2 may output the first driving enable signal EN_A by receiving an output signal of the first NOR gate NOR1. The first NAND gate ND1 may receive the write pulse WT_p and the control signal CTRL_s. The third inverter IV3 may output the second driving enable signal EN_B by receiving an output signal of the first NAND gate ND1.

The first driver 320 may provide one of the first and second driving voltages V_drA and V_drB to the bit line BL in response to the first and second driving enable signals EN_A and EN_B.

The first driver 320 may include a first transistor P1 and a second transistor N1. A gate of the first transistor P1 may receive the first driving enable signal EN_A, a source thereof may receive the first driving voltage V_drA, and a drain thereof may be coupled to the bit line BL. A gate of the second transistor N1 may receive the second driving enable signal EN_B, a drain thereof may be coupled to the bit line BL, and a source thereof may receive the second driving voltage V_drB.

Operations of the first enable signal generator 310 and the driver 320 having the above-described configurations will be described.

When the first enable signal generator 310 disables both the first and second driving enable signals EN_A and EN_B in response to the write pulse WT_p and the control signal CTRL_s, the first driver 320 may not provide either of the first and second driving voltages V_drA and V_drB to the bit line BL.

When the first enable signal generator 310 enables only the first driving enable signal EN_A of the first and second driving enable signals EN_A and EN_B in response to the write pulse WT_p and the control signal CTRL_s, the first driver 320 may provide the first driving voltage V_drA of the first and second driving voltages V_drA and V_drB to the bit line BL.

When the first enable signal generator 310 enables only the second driving enable signal EN_B of the first and second driving enable signals EN_A and EN_B in response to the write pulse WT_p and the control signal CTRL_s, the first driver 320 may provide the second driving voltage V_drB of the first and second driving voltages V_drA and V_drB to the bit line BL.

Figure 5:
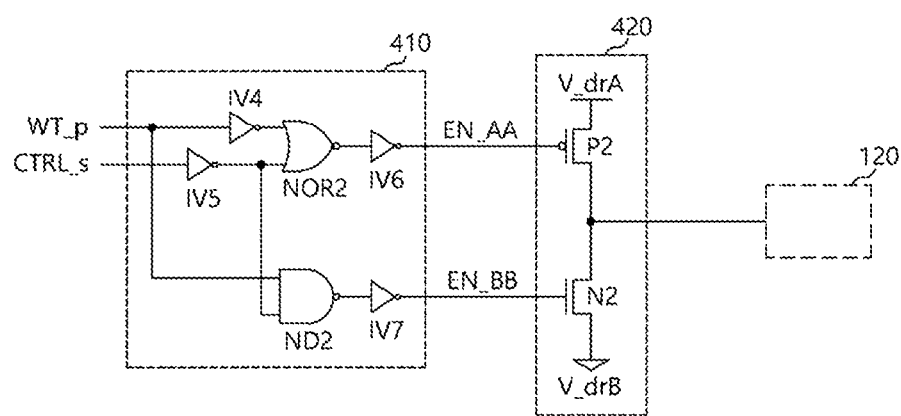
FIG. 5 is a configuration diagram illustrating a second switching driving circuit of FIG. 1.

Referring to FIG. 5, the second switching driving circuit 400 may include a second enable signal generator 410 and a second driver 420.

The second enable signal generator 410 may generate a third driving enable signal EN_AA and a fourth driving enable signal EN_BB in response to the write pulse WT_p and the control signal CTRL_s. For example, the second enable signal generator 410 may enable one of the third and fourth enable signals EN_AA and EN_BB in response to the write pulse WT_p and the control signal CTRL_s. In this example, the second enable signal generator 410 may disable both the third and fourth enable signals EN_AA and EN_BB so that neither of the first and second driving voltages V_drA and V_drB may be provided to the bit line BL through the switching element 120 in the disable period of the write pulse WT_p. The second enable signal generator 410 may enable one of the third and fourth driving enable signals EN_AA and EN_BB so that one of the first and second driving voltages V_drA and V_drB may be provided to the bit line BL through the switching element 120 in response to the control signal CTRL_s in the enable period of the write pulse WT_p. The second enable signal generator 410 may enable the fourth driving enable signal EN_BB so that the second driving voltage V_drB of the first and second driving voltages V_drA and V_drB may be provided to the bit line BL through the switching element 120 when the write pulse WT_p is enabled and the control signal CTRL_s is disabled. The second enable signal generator 410 may enable the third driving enable signal EN_AA so that the first driving voltage V_drA of the first and second driving voltages V_drA and V_drB may be provided to the bit line BL through the switching element 120 when the write pulse WT_p is enabled and the control signal CTRL_s is enabled.

The second enable signal generator 410 may include fourth to seventh inverters IV4, IV5, IV6, and IV7, a second NOR gate NOR2, and a second NAND gate ND2. The fourth inverter IV4 may receive the write pulse WT_p. The fifth inverter IV5 may receive the control signal CTRL_s. The second NOR gate NOR2 may receive output signals of the fourth and fifth inverters IV4 and IV5. The sixth inverter IV6 may output the third driving enable signal EN_AA by receiving an output signal of the second NOR gate NOR2. The second NAND gate ND2 may receive the write pulse WT_p and the output signal of the fifth inverter IV5. The seventh inverter IV7 may output the fourth driving enable signal EN_BB by receiving an output signal of the second NAND gate ND2.

The second driver 420 may provide one of the first and second driving voltages V_drA and V_drB to the bit line BL through the switching element 120 in response to the third and fourth driving enable signals EN_AA and EN_BB.

The second driver 420 may include a third transistor P2 and a fourth transistor N2. A gate of the third transistor P2 may receive the third driving enable signal EN_AA and a source thereof may receive the first driving voltage V_drA. A gate of the fourth transistor N2 may receive the fourth driving enable signal EN_BB, a drain thereof may be coupled to a drain of the third transistor P2, and a source thereof may be receive the second driving voltage V_drB. One of the first and second driving voltages V_drA and V_drB may be transferred to the switching element 120 from a node in which the drain of the third transistor P2 is coupled to the drain of the fourth transistor N2.

Operations of the second enable signal generator 410 and the second driver 420 having the above-described configurations will be described.

When the second enable signal generator 410 disables both the third and fourth driving enable signals EN_AA and EN_BB in response to the write pulse WT_p and the control signal CTRL_s, the second driver 420 may not provide either of the first and second driving voltages V_drA and V_drB to the switching element 120.

When the second enable signal generator 410 enables only the third driving enable signal EN_AA of the third and fourth driving enable signals EN_AA and EN_BB in response to the write pulse WT_p and the control signal CTRL_s, the second driver 420 may provide the first driving voltage V_drA of the first and second driving voltages V_drA and V_drB to the switching element 120.

When the second enable signal generator 410 enables only the fourth driving enable signal EN_BB of the third and fourth driving enable signals EN_AA and EN_BB in response to the write pulse WT_p and the control signal CTRL_s, the second driver 420 may provide the second driving voltage V_drB of the first and second driving voltages V_drA and V_drB to the switching element 120.

An operation of the semiconductor memory apparatus having an above-described configuration according to an embodiment will be described below.

In the write operation, the write pulse WT_p may be generated, the selected word line WL may be enabled, and the driving voltage may be provided to the selected but line BL.

The memory element 110 may receive an output voltage of the first switching driving circuit 300 through the selected bit line BL and may receive an output voltage of the second switching driving circuit 400 through the switching element 120 which is turned on in response to the enabled word line WL.

For example, the memory element 110 may receive the output voltages from the first switching driving circuit 300 and the second switching driving circuit 400 in the write operation.

The voltages applied to the memory element 110 from the first and second switching driving circuits 300 and 400 through the write pulse WT_p in the write operation will be described below.

First, the operation when the switching driving control circuit 200 is configured as illustrated in FIG. 2 will be described.

The switching driving control circuit 200 having the configuration of FIG. 2 may operate to allow the control signal CTRL_s to be transited whenever the write pulse WT_p is input. For example, the switching driving control circuit 200 may enable the control signal CTRL_s when the write pulse WT_p is first input, disable the control signal CTRL_s when the write pulse WT_p is input again, and enable the control signal CTRL_s again when the write pulse WT_p is input again.

The first switching driving circuit 300 may transfer one of the first and second driving voltages V_drA and V_drB to the bit line BL in response to the write pulse WT_p and the control signal CTRL_s. For example, the first switching driving circuit 300 may transfer the one of the first and second driving voltages V_drA and V_drB to the bit line BL in response to the control signal CTRL_s during the enable period of the write pulse WT_p. The first switching driving circuit 300 may transfer the first driving voltage V_drA to the bit line BL when the write pulse WT_p is enabled and the control signal CTRL_s is disabled. The first switching driving circuit 300 may transfer the second driving voltage V_drB to the bit line BL when the write pulse WT_p is enabled and the control signal CTRL_s is enabled.

The second switching driving circuit 400 may transfer one of the first and second driving voltages V_drA and V_drB to the switching element 120 in response to the write pulse WT_p and the control signal CTRL_s. For example, the second switching driving circuit 400 may transfer one of the first and second driving voltages V_drA and V_drB to the switching circuit 120 in response to the control signal CRTL_s during the enable period of the write pulse WT_p. The second switching driving circuit 400 may transfer the second driving voltage V_drB to the switching element 120 when the write pulse WT_p is enabled and the control signal CTRL_s is disabled. The second switching driving circuit 400 may transfer the first driving voltage V_drA to the switching element 120 when the write pulse WT_p is enabled and the control signal CRTL_s is enabled.

When the first switching driving circuit 300 applies the first driving voltage V_drA to the bit line BL, the second switching driving circuit 400 may apply the second driving voltage V_drB to the switching element 120. When the first switching driving circuit 300 applies the second driving voltage V_drB to the bit line BL, the second switching driving circuit 400 may apply the first driving voltage V_drA to the switching element 120.

For example, when the first switching driving circuit 300 applies the first driving voltage V_drA to the bit line BL in response to the control signal CTRL_s output from the switching driving control circuit 200, the second switching driving circuit 400 may apply the second driving voltage V_drB to the switching element 120. When the first switching driving circuit 300 applies the second driving voltage V_drB to the bit line BL in response to the control signal CTRL_s output from the switching driving control circuit 200, the second switching driving circuit 400 may apply the first driving voltage V_drA to the switching element 120.

The operation of the semiconductor memory apparatus according to an embodiment will be described below with reference to FIG. 6 on the assumption that a voltage level of the first driving voltage V_drA is greater than that of the second driving voltage V_drB.

The semiconductor memory apparatus including the switching driving control circuit 200 of FIG. 2 may allow the control signal CTRL_s to be transited whenever the write pulse WT_p is input in the write operation.

The first and second switching driving circuits 300 and 400 may alternately output the first driving voltage V_drA and the second driving voltage V_drB according to the control signal CTRL_s transited whenever the write pulse WT_p is input.

Figure 6A:
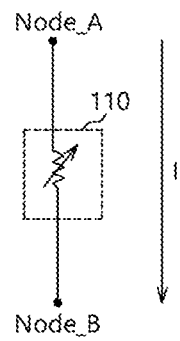
FIGS. 6A and 6B are diagrams for explaining an operation of a semiconductor memory apparatus according to an embodiment of the disclosure.

When the first switching driving circuit 300 outputs the first driving voltage V_drA and the second switching driving circuit 400 outputs the second driving voltage V_drB, a current I may flow from the first node Node_A to the second node Node_B via the memory element 110 as illustrated in FIG. 6A.

Figure 6B:
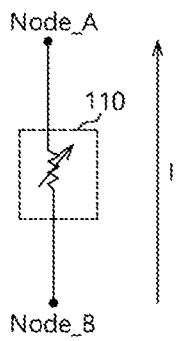

When the first switching driving circuit 300 outputs the second driving voltage V_drB and the second switching driving circuit 400 outputs the first driving voltage V_drA, a current I may flow from the second node Node_B to the first node Node_A via the memory element 110 as illustrated in FIG. 6B.

A resistance value of the memory element 100 may be determined by a voltage difference between both ends of the memory element 110, that is, between the first and second nodes Node_A and Node_B regardless of a direction of the current flowing through the memory element 110.

The semiconductor memory apparatus according to an embodiment may change the direction of the current flowing through the memory element whenever the write pulse is input in the write operation. Accordingly, the change in the composition of the memory element may be slowed, and thus durability of the memory element may be improved.

The operation when the switching driving control circuit 200 is configured as illustrated in FIG. 3 will be described.

The switching driving control circuit 200 having the configuration of FIG. 3 may operate to allow the control signal CTRL_s to be transited whenever the input number of write pulses WT_p is equal to a preset number.

The first switching driving circuit 300 may transfer the first driving voltage V_drA to the bit line BL when the write pulse WT_p is enabled and the control signal CTRL_s is disabled. The first switching driving circuit 300 may transfer the second driving voltage V_drB to the bit line BL when the write pulse WT_p is enabled and the control signal CTRL_s is enabled.

The second switching driving circuit 400 may transfer the second driving voltage V_drB to the switching element 120 when the write pulse WT_p is enabled and the control signal CTRL_s is disabled. The second switching driving circuit 400 may transfer the first driving voltage V_drA to the switching element 120 when the write pulse WT_p is enabled and the control signal CRTL_s is enabled.

When the first switching driving circuit 300 applies the first driving voltage V_drA to the bit line BL, the second switching driving circuit 400 may apply the second driving voltage V_drB to the switching element 120. When the first switching driving circuit 300 applies the second driving voltage V_drB to the bit line BL, the second switching driving circuit 400 may apply the first driving voltage V_drA to the switching element 120.

For example, when the first switching driving circuit 300 applies the first driving voltage V_drA to the bit line BL in response to the control signal CTRL_s output from the switching driving control circuit 200, the second switching driving circuit 400 may apply the second driving voltage V_drB to the switching element 120. When the first switching driving circuit 300 applies the second driving voltage V_drB to the bit line BL in response to the control signal CTRL_s output from the switching driving control circuit 200, the second switching driving circuit 400 may apply the first driving voltage V_drA to the switching element 120.

The operation of the semiconductor memory apparatus according to an embodiment will be described below with reference to FIG. 6 on the assumption that a voltage level of the first driving voltage V_drA is greater than that of the second driving voltage V_drB.

The semiconductor memory apparatus including the switching driving control circuit 200 of FIG. 3 may allow the control signal CTRL_s to be transited when the preset number of write pulses WT_p is input in the write operation.

The first and second switching driving circuits 300 and 400 may alternately output the first driving voltage V_drA and the second driving voltage V_drB according to the control signal CTRL_s transited when the preset number of write pulses WT_p is input.

When the first switching driving circuit 300 outputs the first driving voltage V_drA and the second switching driving circuit 400 outputs the second driving voltage V_drB, a current I may flow from the first node Node_A to the second node Node_B via the memory element 110 as illustrated in FIG. 6A.

When the first switching driving circuit 300 outputs the second driving voltage V_drB and the second switching driving circuit 400 outputs the first driving voltage V_drA, a current I may flow from the second node Node_B to the first node Node_A via the memory element 110 as illustrated in FIG. 6B.

A resistance value of the memory element 110 may be determined by a voltage difference between both ends of the memory element 110, that is, between the first and second nodes Node_A and Node_B regardless of a direction of the current flowing through the memory element 110.

The semiconductor memory apparatus according to an embodiment may change the direction of the current flowing through the memory element whenever the preset number of write pulses WT_p is input in the write operation. Accordingly, the change in the composition of the memory element may be slowed, and thus durability of the memory element may be improved.

Figure 7:
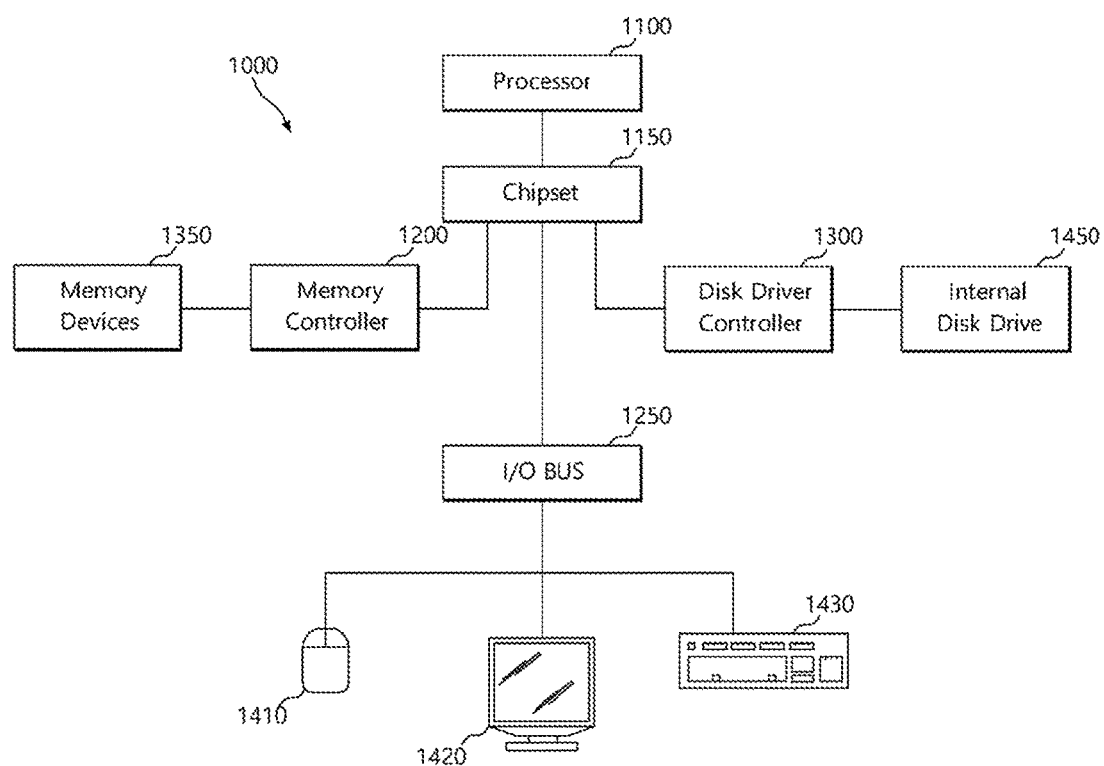
FIG. 7 illustrates a block diagram of an example of a representation of a system employing a semiconductor memory apparatus with the various embodiments discussed above with relation to FIGS. 1-6B.

The semiconductor memory apparatuses as discussed above (see FIGS. 1-6B) are particular useful in the design of other memory devices, processors, and computer systems. For example, referring to FIG. 7, a block diagram of a system employing a semiconductor memory apparatus in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor memory apparatus as discussed above with reference to FIGS. 1-6B. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor memory apparatus as discussed above with relation to FIGS. 1-6B, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 7 is merely one example of a semiconductor memory apparatus as discussed above with relation to FIGS. 1-6B. In alternate embodiments, such as, for example but not limited to, cellular phones or digital cameras, the components may differ from the embodiments illustrated in FIG. 7.

The above embodiments of the present disclosure are illustrative and not limitative. Various alternatives and equivalents are possible. The embodiments are not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A semiconductor memory apparatus comprising:
   a first switching driving circuit configured to transfer one of a first driving voltage and a second driving voltage to a memory cell through a bit line whenever a control signal is transited in response to a write pulse; and
   a second switching driving circuit configured to transfer one of the first driving voltage and the second driving voltage to the memory cell whenever the control signal is transited in response to the write pulse,
   wherein the first switching driving circuit includes an enable signal generator configured to generate first and second driving enable signals in response to the write pulse and the control signal and a driver configured to provide one of the first and second driving voltages to the memory cell in response to the first and second driving enable signals, and
   wherein the enable signal generator includes a first logic gate configured to invert the write pulse, a second logic gate configured to output the first driving enable signal for transferring the one of the first and second driving voltages in response to an inverted write pulse and the control signal, and a third logic gate configured to output the second driving enable signal for transferring the one of the first and second driving voltages in response to the write pulse and the control signal.

2. The semiconductor memory apparatus of claim 1, wherein the first driving voltage has a greater voltage level than the second driving voltage.

3. The semiconductor memory apparatus of claim 2, wherein the second switching driving circuit provides the second driving voltage to the memory cell when the first switching driving circuit provides the first driving voltage to the memory cell.

4. The semiconductor memory apparatus of claim 3, wherein the second switching driving circuit provides the first driving voltage to the memory cell when the first switching driving circuit provides the second driving voltage to the memory cell.

5. The semiconductor memory apparatus of claim 1, further comprising a switching driving control circuit configured to generate the control signal for controlling the first and second switching driving circuits to output one of the first and second driving voltages in response to the write pulse.

6. The semiconductor memory apparatus of claim 5, wherein the switching driving control circuit allows the control signal to be transited when the write pulse is input.

7. The semiconductor memory apparatus of claim 6, wherein the second switching driving circuit outputs the second driving voltage and the first switching driving circuit outputs the first driving voltage when the control signal is transited.

8. The semiconductor memory apparatus of claim 7, wherein the second switching driving circuit outputs the first driving voltage and the first switching driving circuit outputs the second driving voltage when the control signal is transited again.

9. The semiconductor memory apparatus of claim 5, wherein the switching driving control circuit allows the control signal to be transited when a preset number of write pulses is input.

10. The semiconductor memory apparatus of claim 9, wherein the first switching driving circuit outputs one driving voltage of the first driving voltage and the second driving voltage and the second switching driving circuit outputs the other driving voltage of the first driving voltage and the second driving voltage whenever the control signal is transited.

11. A semiconductor memory apparatus comprising:
    a memory element;
    a first switching driving circuit configured to apply one driving voltage of a first driving voltage and a second driving voltage to one end of the memory element whenever a control signal is transited in response to a write pulse;
    a second switching driving circuit configured to apply the other driving voltage of the first driving voltage and the second driving voltage to the other end of the memory element whenever the control signal is transited in response to the write pulse; and
    a switching driving control circuit configured to generate, in response to the write pulse, the control signal for selecting output voltages of the first and second switching driving circuits,
    wherein the first switching driving circuit includes an enable signal generator configured to generate first and second driving enable signals in response to the write pulse and the control signal and a driver configured to provide one of the first and second driving voltages to the memory cell in response to the first and second driving enable signals, and
    wherein the enable signal generator includes a first logic gate configured to invert the write pulse, a second logic gate configured to output the first driving enable signal for transferring the one of the first and second driving voltages in response to an inverted write pulse and the control signal, and a third logic gate configured to output the second driving enable signal for transferring the one of the first and second driving voltages in response to the write pulse and the control signal.

12. The semiconductor memory apparatus of claim 11, wherein the first driving voltage has a greater voltage level than the second driving voltage.

13. The semiconductor memory apparatus of claim 12, wherein the switching driving control circuit allows the control signal to be transited when the write pulse is input.

14. The semiconductor memory apparatus of claim 13, wherein the first switching driving circuit outputs the first driving voltage and the second switching driving circuit outputs the second driving voltage when the control signal is disabled, and the first switching driving circuit outputs the second driving voltage and the second switching driving circuit outputs the first driving voltage when the control signal is enabled.

15. The semiconductor memory apparatus of claim 12, wherein the switching driving control circuit allows the control signal to be transited when a preset number of write pulses is input.

16. The semiconductor memory apparatus of claim 15, wherein the switching driving control circuit includes:
  a counter configured to generate a counting code by counting the write pulse whenever the write pulse is input;
  a comparator configured to generate a reset pulse when the counting code is the same as a target pulse; and
  a control signal generator configured to allow the control signal to be transited whenever the reset pulse is input.

17. The semiconductor memory apparatus of claim 16, wherein the counter initializes the counting code when the reset pulse is generated.

18. The semiconductor memory apparatus of claim 13, wherein the first switching driving circuit outputs the first driving voltage and the second switching driving circuit outputs the second driving voltage when the control signal is disabled, and the first switching driving circuit outputs the second driving voltage and the second switching driving circuit outputs the first driving voltage when the control signals is enabled.

19. A semiconductor memory apparatus comprising:

a memory element;

a first switching driving circuit coupled to the memory element; and a second switching driving circuit coupled to the memory element, wherein the first and second switching driving circuits are configured to change a direction of a current flowing through the memory element whenever a control signal is transited in response to a write pulse, wherein the first switching driving circuit includes an enable signal generator configured to generate first and second driving enable signals in response to the write pulse and the control signal and a driver configured to provide one of the first and second driving voltages to the memory cell in response to the first and second driving enable signals, and wherein the enable signal generator includes a first logic gate configured to invert the write pulse, a second logic gate configured to output the first driving enable signal for transferring the one of the first and second driving voltages in response to an inverted write pulse and the control signal, and a third logic gate configured to output the second driving enable signal for transferring the one of the first and second driving voltages in response to the write pulse and the control signal.

20. The semiconductor memory apparatus of claim 19, further comprising:

a switching driving control circuit configured to generate, in response to the write pulse, the control signal for controlling the first and second switching driving circuits to change the direction of the current flowing through the memory element.

* * * * *